United States Patent [19]

Yu et al.

[11] Patent Number: 5,032,233

[45] Date of Patent: Jul. 16, 1991

[54] METHOD FOR IMPROVING STEP COVERAGE OF A METALLIZATION LAYER ON AN INTEGRATED CIRCUIT BY USE OF A HIGH MELTING POINT METAL AS AN ANTI-REFLECTIVE COATING DURING LASER PLANARIZATION

[75] Inventors: Chang Yu; Trung T. Doan; Gurtej S. Sandhu, all of Boise, Id.

[73] Assignee: Micron Technology, Inc., Boise, Id.

[21] Appl. No.: 578,545

[22] Filed: Sep. 5, 1990

[51] Int. Cl.$^5$ .................... B05D 3/06; B05D 5/12; C23C 14/34

[52] U.S. Cl. ................ 204/192.28; 427/53.1; 427/97; 427/123; 204/192.15

[58] Field of Search .............. 427/53.1, 54.1, 97, 427/96, 123, 125, 56.1; 204/192.12, 192.15, 192.28

[56] References Cited

U.S. PATENT DOCUMENTS

| | | | |
|---|---|---|---|
| 4,335,198 | 6/1982 | Hanada et al. | 427/53.1 |
| 4,388,517 | 6/1983 | Schulte et al. | 427/53.1 |
| 4,431,459 | 2/1984 | Teng | 427/53.1 |
| 4,674,176 | 6/1987 | Tuckerman | 427/53.1 |
| 4,681,795 | 7/1987 | Tuckerman | 427/53.1 |

OTHER PUBLICATIONS

"Interconnects on Integrated Circuits Improved by Excimer Laser Planarization for Multilevel Metallization," by Mukai, et al., pp. 101–107, i.e., VLSI Multilevel Interconnection Conference, Santa Clara, CA (1988).

"The Use of Ti as an Antireflective Coating for the Laser Planarization of Al for VLSI Metallization" (Executive Summary), by Lai et al., VMIC Conference, 1989.

Primary Examiner—Shrive P. Beck
Assistant Examiner—Marianne Padgett
Attorney, Agent, or Firm—Wells, St. John & Roberts

[57] ABSTRACT

A method for improving step coverage of metallization layers of an aluminum alloy on an integrated circuit involves use of a deposited layer of a high melting point metal, such as tungsten or an alloy of tungsten and titanium, as an anti-reflective coating (ARC) to increase the efficient use of laser energy for planarization purposes where the underlying aluminum alloy covers a step, such as at an open via.

10 Claims, 1 Drawing Sheet

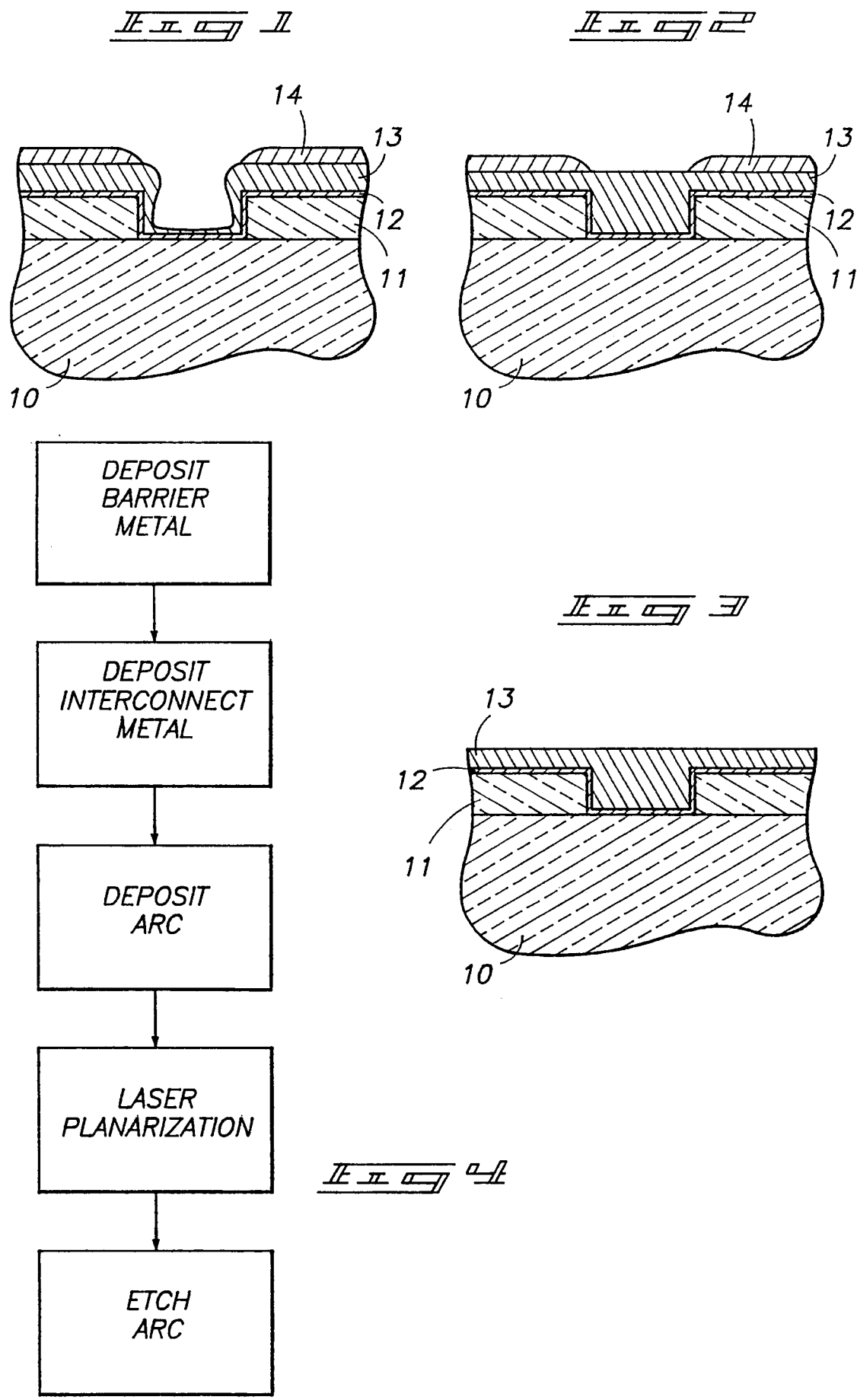

METHOD FOR IMPROVING STEP COVERAGE OF A METALLIZATION LAYER ON AN INTEGRATED CIRCUIT BY USE OF A HIGH MELTING POINT METAL AS AN ANTI-REFLECTIVE COATING DURING LASER PLANARIZATION

TECHNICAL FIELD

This disclosure relates to metallization of integrated circuits, particularly to improvements in laser planarization of a low boiling point metallization layer at micron/submicron geometry contact vias on integrated circuits.

BACKGROUND OF THE INVENTION

In the metallization step utilized in the production of integrated circuits preparatory to etching of conductors and bonding pads about their outer surfaces, step-coverage of conductive metal films (typically low boiling point metals, such as aluminum and/or copper alloys) is poor over surface discontinuities, such as via holes, where contact bonding must take place.

Step coverage of conductive metal films deposited conventionally by evaporation or sputtering becomes progressively worse as the dimensions of components on the integrated circuit shrink. The poor step coverage is a result of the "shadow effect" in the deposited film at the sidewalls of steps or holes.

Although the above-mentioned step coverage problem can be solved to some degree by either chemical vapor deposition of tungsten, or by metal deposition using high temperature and/or bias sputtering, the improvement in the step coverage is achieved at the expense of several drawbacks. For chemical vapor deposition of tungsten, the film resistivity is about three times higher than that of aluminum of aluminum alloys. On the other hand, high temperature and/or bias sputtering usually results in poor film qualities such as low electron migration resistance, and high dislocation density.

The use of a pulsed laser to melt and planarize thin metal films having low boiling points to fill high aspect ratio contact vias is a very attractive approach to current high density circuit metallization. Planarization of the conductive surface is particularly desirable when vias are stacked vertically in multilevel metallization. Laser planarization is a low thermal budget, simple, and effective technique for planarizing conductive metal layers and filling interlevel contacts at the cost of only one additional step to the standard process flow.

Excimer laser planarization relies on a very short laser pulse to rapidly melt an absorbing metal layer. During the molten period, mass transport of the conductive metal occurs, which results in flow of the metal into vias and drives the surface flat due to the high surface tension and low viscosity of molten metals.

Recently, the technique of laser planarization has shown promise in improving the step coverage of aluminum alloy films in micron/submicron geometry contacts and contact vias. However, due to the high reflectivity of aluminum (approximately 93% for wave lengths in the region down to 200 mm) and its relatively low evaporation temperature (2467° C.), aluminum alloys suffer from the following disadvantages: (1) inefficient use of laser energy, (2) low optical ablation limit, and (3) low process window between the ablation limit and the via-fill limit.

Planarization systems utilizing excimer laser irradiation show particular promise for filling submicron-diameter vias and planarizing the resulting surface. Lessening of the surface reflectivity normally encountered in heating of aluminum alloys by laser energy has already been reported as widening the "process window" between the "ablation limit", or temperature at which the conductive metal boils or evaporates, and the "via-fill limit", or temperature at which sufficient flow of the conductive metal occurs to fill the circuit recesses.

A general discussion of laser planarization can be found in a paper titled "Interconnects on Integrated Circuits Improved by Excimer Laser Planarization for Multilevel Metallization" by Mukai, et al., pp. 101–107, i.e., VLSI Multilevel Interconnection Conference, Santa Clara, CA (1988), which is hereby incorporated into this disclosure by reference. It describes the use of a thin copper overcoating to enhance aluminum planarization processing by increasing the initial optical absorbance of the laser beam in the conductive metal film. The paper fails to address the generally recognized low oxidation resistance of copper and the difficulty of subsequently etching such copper coatings.

Use of titanium as an anti-reflective coating for laser planarization processes has also been proposed. However, reported improvements in planarization were achieved at the expense of several drawbacks, including high resistivity and stress. The higher resistivity of the Ti—Al alloys that result from intermixing of these materials during laser planarization diminishes the advantage of aluminum metallization over alternative metallization schemes using chemical vapor deposited tungsten as the primary conductive medium. Moreover, the higher stresses in the resulting Ti—Al alloys imposes reliability concerns, such as adhesion, cracks and stress voiding. It has therefore been concluded by prior researchers that titanium itself is not a desirable anti-reflective coating for aluminum and aluminum alloys in metallization procedures.

Despite the shortcomings in presently-reported systems for laser planarization, the value of an anti-reflective coating in widening the process window has been concluded to be important and to have demonstrated usefulness in increasing the thickness of a layer of conductive metal across a step or via.

A search for alternative anti-reflective coatings has led to the present identification of deposited layers of high boiling point metals, such as tungsten or an alloy of tungsten and titanium, as a useful coating. A layer of the selected metal is proposed as an anti-reflective coating on aluminum alloys or other low boiling point metals used for metallization purposes. The addition of a the metallic film prior to laser planarization results in more efficient use of laser energy, less ablation of the aluminum layer at a given optical fluence, and widening of the process window. Its application over the conductive metal film is controlled to eliminate or minimize intermixing of the anti-reflective coating and metallization layer during laser planarization. The anti-reflective layer can then be substantially removed by etching, leaving the metallization layer exposed for further conventional processing steps.

BRIEF DESCRIPTION OF THE DRAWINGS

The preferred embodiment of the invention is illustrated in the accompanying drawings, in which:

FIG. 1 is a diagrammatic cross-sectional view showing the initial metallization films;

FIG. 2 is a diagrammatic view of the films following laser planarization;

FIG. 3 is a diagrammatic view of the films following etching of the ARC; and

FIG. 4 is a flow diagram of the steps carried out in this process.

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

The present method is directed specifically toward improvement of step coverage of a metallization layer on an integrated circuit having micron/submicron geometry contact vias (1 by 1 micron or less in area).

The use of excimer lasers to melt and planarize an aluminum alloy film used in the metallization of integrated circuits has been previously recognized as holding out possibilities of both improved step coverage and economical manufacturing of high density integrated circuits. However, several difficulties are inherent in this technique: (1) aluminum and its alloys, widely used as metallization layers, are highly reflective to light, down to approximately 200 nm, leading to inefficient use of the laser power directed to an aluminum film for planarizing purposes; (2) the low absorbance of aluminum and its alloys enhances localized ablation at points where surface irregularities absorb more light than the areas surrounding them; and (3) the process window of ±6–8% for laser planarization of aluminum and its alloys is relatively narrow.

While reports have been published with respect to using copper and titanium as anti-reflective coatings (ARC) to solve these problems, the choice of these metals has apparently been dictated solely by their reflective qualities. The present improvements to these systems take into account not only the reflectivity of the coating metal, but also its electrical and thermal properties and its resistance to oxidation. The resistivity of the intermixed ARC must not be detrimental to the fundamental purpose of the metallization layer, which is to serve as an effective electrical conductor. By selecting metals having relatively high melting and boiling points in comparison to the low melting and boiling point of the underlying metallization layer, intermixing of the two layers is minimized or eliminated, thereby assuring that the electrical and physical properties of the metallization layer survive the process substantially intact. Resistance to oxidation of the ARC is of particular importance because the processed wafer typically is exposed to air when moving from the planarization equipment to the next processing station. Oxidized ARC surfaces can be detrimental to subsequent etching processes required for its removal.

The method of this invention is outlined in FIG. 4. Following the use of standard processes to produce an integrated circuit, the metallization steps first involve depositing a conventional barrier metal by sputtering. Then the metallization layer, which can be an aluminum alloy or other low melting and boiling point metal (such as copper or copper alloys), is deposited in a covering film by sputtering or other conventional deposition processes suitable for the electrically conductive metal to form a metallization layer having a thickness between approximately 3,000 angstroms and 1.5 microns. A layer of high melting and boiling point metal is next deposited as an anti-reflective coating over the metallization layer, using sputtering techniques to assure that it does not cover or overlap the recess or via where step coverage is to be improved. The sputtered anti-reflective coating being deposited so as to not overlap or cover the micron/submicron contact vias after deposit of the metallization layer. This prevents subsequent intermixing due to the resulting mass flow of melted metal that occurs in the metallization layer during the planarization step. The second depositing step is carried out by sputtering the anti-reflective coating a thickness less than 1,000 angstroms.

The final step leading to covering of the via or hole is laser planarization. This is accomplished by directing optical pulse irradiation from an excimer laser onto the area of the via, causing absorption of the laser beam within the anti-reflective coating 14. During laser planarization, the low melting and boiling point metallization layer will melt and flow into the open spaces of the via or other recess, but most or all of the high melting and boiling point metal covering it will remain in a solid state. The anti-reflective layer can then be removed by etching or other suitable techniques, leaving the planar outer surface of the metallization layer exposed for subsequent processing.

The anti-reflective coating must have a reflectivity value less than that of the metallization layer. It must further have a melting point sufficiently higher than that of the metallization layer to insure that intermixing of the two layers and resultant increasing of resistivity of the metallization layer will not occur during laser planarization.

FIG. 1, illustrates the laminate after deposition of the anti-reflective coating and prior to planarization. The underlying substrate is designated by reference numeral 10. A covering insulating layer 11 overlies the semiconductor components (not shown). The exterior surface of the layer 11 and the exposed surfaces on substrate 10 are apertured to form a via. The surfaces are covered by a barrier metal 12, such as Ti:W, which serves both as a wetting layer and a diffusion barrier.

A metallization layer of a low melting point metal, such as an aluminum alloy 13 extends across the via. The thickness of the aluminum alloy along the walls and bottom surface of the micron/submicron via is relatively thin or is discontinued, due to the shadow effect that occurs when coating a hole. The deposited anti-reflective coating is illustrated at 14. Note that it does not overlap the recessed contact region.

As shown in FIG. 2, subsequent laser planarization causes the aluminum alloy 13 to flow into the open via or hole. Finally, the outer layer of metallic material is removed by etching, resulting in a relatively plane outer surface in the resulting laminate (FIG. 3).

As the structure shown in FIG. 1 is subjected to laser irradiation, the metallization layer 13 is melted. This is facilitated by the reflective nature of the anti-reflective coating. The properties of the anti-reflective coating, with respect to the laser energy wave lengths, widens the planarization process window by the resulting increase in efficient use of laser energy to melt the conductive metal and a lowering of the via-fill limit. This can be attributed to the reflective properties of the selected metal layer covering most of the conductive metal layer.

By carefully controlling the areas about which application of the metallic material occurs, there will be little intermixing of the two metal layers. This is important, since the higher resistivity of the anti-resistive coating is undesirable in the conductors subsequently formed in the metallization layer. To further minimize intermixing, the use of low energy laser irradiation is preferred, leaving an outer layer of metallic material that can be removed by etching at the end of the process.

The major criterion for a film to function effectively as an anti-reflective coating is to have high optical absorbance and high melting and boiling temperatures. Experimental tests have been conducted using tungsten and a tungsten-titanium alloy (Ti-10%, W-90%) as anti-reflective coatings for the laser planarization of aluminum films. As shown in Table 1, the optical absorbance of the anti-reflective coating materials is significantly higher than that of aluminum. In addition, the higher melting and melting and boiling points of the selected metals are important to preserve the integrity of the anti-reflective coatings during exposure to laser energy. The properties of the aluminum film, such as grain size and resistivity after laser planarization, are determined by the degree of alloying and/or diffusion of atoms from the covering anti-reflective coating. Therefore, the state of an anti-reflective coating during exposure to laser beam and subsequent thermal cycle is very important from the standpoint of its usefulness.

TABLE 1

Bulk properties of various anti-reflective coatings and aluminum (From the Handbook of Physics and Chemistry)

| MATERIAL | REFLECTIVITY (%) | MELTING POINT (°C.) | BOILING POINT (°C.) |
|---|---|---|---|
| tungsten (CVD) | 45.1 | 3410 | 5660 |
| TiW (1:9) | NA | 3000 | NA |
| Al | 92.5 | 660 | 2467 |

The substrates used in this study were 150 mm diameter, p-type<100>Si wafers coated with 1.0 μm thick layer of boron phosphate doped silicon glass (BPSG) and then patterned with 1×1 μm contact vias. A TiW (for TiW and CVD tungsten anti-reflective coatings) diffusion barrier layer of thicknesses 100 nm and 50 nm respectively and an AlSi(1%)Cu(0.5%) layer 800 nm in thickness were then sputter deposited. The anti-reflective coating films (with the exception of tungsten films) were all deposited in-situ in a multi-chamber sputtering system after the aluminum-alloy deposition. Tungsten was deposited in a cold-wall reactor CVD system. The thickness of the various anti-reflective coating films used was 30 nm for CVD tungsten and 35 nm for TiW.

Optical reflectivity data on the sandwich structure obtained for various anti-reflective coating's is shown in table 2. The samples with anti-reflective coating films showed lower reflectivity compared to bare aluminum films. These multi-layered structures were then exposed to an excimer pulse laser of wavelength 308 nm. The energy of the laser pulse used during various experiments was around 470-500 mJ and the substrate temperature was kept at 300° C.

Scanning electron microscope micrographs of contact vias before and after laser planarization with and without and anti-reflective coating were reviewed after planarization. In the case of bare aluminum films, for a substrate temperature of 300° C., complete filling of the contacts was not observed even for an optical fluence of 4.8 J/cm² which was the maximum optical fluence below ablation. In the case of TiW anti-reflective coating however, complete filling was observed at 2.7 J/cm².

Table 2 lists the minimum optical fluences required for complete filling and the maximum fluence before the onset of ablation for a substrate temperature of 300° C. for each anti-reflective coating and bare aluminum. The data for aluminum was taken at a substrate temperature of 400° C. since no complete filling was observed for bare aluminum at 300° C.

The process window values in Table 2 were calculated by using the expression:

$$\text{Process Window} = \frac{F_a - F_f}{F_a + F_f}$$

where, $F_f$ is the minimum optical fluence required for complete filling and $F_a$ is the optical fluence at the onset of optical ablation.

The process window (complete contact filling to ablation) for the contact filling was determined for all the anti-reflective coating's under various process conditions. The process windows were calculated for a substrate temperature of 300° C. For the case of no anti-reflective coating however, the process window is for a substrate temperature of 400° C. since complete filling could not be achieved for any laser fluence below optical ablation.

The reflectivity values in Table 2 were measure in relation to the reflectivity of silicon.

TABLE 2

Optical reflectivity of anti-reflective coating/800 nm aluminum/SiO₂/Si structures with CVD tungsten (30 nm) and TiW (35 nm) as anti-reflective coatings

| Material | Reflectivity (%) | $F_f$ (J/cm²) | $F_a$ (J/cm²) | Process Window (%) |
|---|---|---|---|---|
| W (CVD) | 102.2 | 2.81 | 3.86 | 16 |
| TiW | 124.7 | 2.70 | 3.36 | 11 |
| Al* | 152.2 | 4.47 | 4.90 | 5 |

*Substrate temperature of 400 C.
$F_f$ — minimum optical fluence required for complete filling.
$F_a$ — optical fluence for the onset of optical ablation.

As shown in Table 2, both anti-reflective coatings showed an improvement in the process window at a substrate temperature much lower than that required for complete filling when no anti-reflective coating is used. The most improvement was observed for the tungsten anti-reflective coating which reflects the fact that the sandwich structure with tungsten anti-reflective coating showed lowest optical reflectivity.

In addition, the percentage filling of the contacts was calculated from the ratio of the filled and total contact area as determined from cross-sectional micrographs. The TiW anti-reflective coating resulted in complete filling at a much lower optical fluence compared to the tungsten anti-reflective coating. However, compared to tungsten anti-reflective coating, the optical ablation also occurred at a lower optical fluence, resulting in a smaller process window for the TiW alloy. For the case of no anti-reflective coating however, the maximum filling observed at 4.9 J/cm2 was less than 40%.

The surface morphology of the aluminum-alloy film after laser planarization has important implications for the subsequent patterning of interconnect lines. Optical micrographs of TiW/Al-alloy films deposited on an array of 0.9 μm deep contact holes etched into BPSG were reviewed both before and after laser planarization. For a relatively lower optical fluence of 0.97 J/cm$^2$, the surface became wrinkled. This probably resulted from melting of the aluminum film underneath anti-reflective coating whereas the TiW film stayed in the solid form. The increase in the plasticity of the TiW film due to rise in the temperature during exposure to laser presumably prevented any cracking. For this laser fluence, very little contact filling was observed. For higher laser fluences, the observed absence of wrinkles could be due to alloying of TiW with aluminum and/or melting of the TiW film during laser planarization.

Preliminary electrical data on the films showed that the resistivity of aluminum film after laser planarization did not show a significant increase when using Tungsten or TiW alloy as an anti-reflective coating, as has been experienced when using titanium for this purpose.

The use of an anti-reflective coating in general resulted in lowering of the optical fluences required for complete filling as well as for the onset of optical ablation. The anti-reflective coatings used to date resulted in improvement of the process window by 11 to 16 percent. The improvement in the process window closely followed the optical reflectivity characteristics of various anti-reflective coatings. CVD tungsten anti-reflective coating gave best results in terms of the most increase in the process window. This follows from lower optical reflectivity and higher melting temperature of tungsten.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A method for improving step coverage of a metallization layer on an integrated circuit having micron/submicron geometry contact vias, comprising the following sequential steps:

depositing a metallization layer of an electrically conductive metal having a low melting and boiling point;

depositing an anti-reflective coating on the metallization layer, the anti-reflective coating having a reflectivity value less than that of the metallization layer, the anti-reflective coating further having a melting and boiling point sufficiently higher than that of the metallization layer to insure that intermixing of the two layers and resultant increasing of resistivity of the metallization layer will not occur during laser planarization; and subjecting the resulting laminate to laser planarization to melt the metallization layer and cause it to flow into the contact vias without melting the anti-reflective coating.

2. The method of claim 1 wherein the anti-reflective coating is tungsten.

3. The method of claim 1 wherein the anti-reflective coating is a tungsten alloy.

4. The method of claim 1 wherein the anti-reflective coating is a tungsten and titanium alloy.

5. The method of claim 1 wherein the metallization layer comprises an aluminum alloy.

6. The method of claim 1, further including the following additional sequential step:

removing the remaining anti-reflective coating after the laser planarization step.

7. The method of claim 1 wherein the step of depositing the anti-reflective coating involves its placement on the metallization layer only about those areas of the integrated circuit outside its micron/submicron geometry contact vias, thereby minimizing subsequent opportunities for intermixing of the metallization layer and the anti-reflective coating during laser planarization.

8. The method of claim 1 wherein the first depositing step forms a metallization layer having a thickness between approximately 3,000 Angstroms and 1.5 microns and the second depositing step is carried out by sputtering the anti-reflective coating a thickness less than 1,000 Angstroms, the sputtered anti-reflective coating being deposited so as to not overlap or cover the micron/submicron contact vias after deposit of the metallization layer.

9. The method of claim 1 including the following step:

selecting an anti-reflective coating having physical properties that widen the planarization process window by lowering the via-fill limit of the metallization layer without proportionally lowering its ablation limit.

10. The method of claim 9 wherein the lowering of the via-fill limit is attributable to a combination of the reflective properties of the anti-reflective coating, as well as its thermal conductivity and specific heat, and the lack of a proportional lowering of the ablation limit is attributable to its melting and boiling point.

* * * * *